United States Patent
Yang et al.

(10) Patent No.: US 8,710,530 B2
(45) Date of Patent: Apr. 29, 2014

(54) LIGHT EMITTED DIODE

(75) Inventors: Shih Pu Yang, Kaohsiung (TW); Jui-Yi Chu, Taichung (TW)

(73) Assignee: Lextar Electronics Corp., Hsinchu (TW)

(*) Notice: Subject to any disclaimer, the term of this patent is extended or adjusted under 35 U.S.C. 154(b) by 0 days.

(21) Appl. No.: 13/572,209

(22) Filed: Aug. 10, 2012

(65) Prior Publication Data

US 2013/0256722 A1     Oct. 3, 2013

(30) Foreign Application Priority Data

Mar. 30, 2012  (TW) .............................. 101111425 A

(51) Int. Cl.
*H01L 29/22*    (2006.01)
(52) U.S. Cl.
USPC .................................... 257/98; 257/E33.072

(58) Field of Classification Search
USPC .............................. 257/97, E33.033, E33.034
See application file for complete search history.

(56) References Cited

U.S. PATENT DOCUMENTS

| | | | |
|---|---|---|---|
| 7,286,584 B2 * | 10/2007 | Wang et al. | 372/43.01 |
| 7,332,365 B2 * | 2/2008 | Nakamura et al. | 257/94 |
| 7,863,631 B2 * | 1/2011 | Krames et al. | 257/97 |

* cited by examiner

*Primary Examiner* — Chandra Chaudhari
(74) *Attorney, Agent, or Firm* — Li & Cai Intellectual Property (USA) Office

(57) ABSTRACT

The present invention relates to a light emitted diode (LED). The LED includes a metal mirror, a bonding substrate, a distributed bragg reflector (DBR), a buffer layer, and a LED epitaxial structure. The bonding substrate is arranged under the metal mirror. The DBR is arranged on the metal mirror. The buffer layer is arranged on the DBR. The LED epitaxial structure is arranged on the buffer layer.

16 Claims, 5 Drawing Sheets

LIGHT EMITTED DIODE

BACKGROUND

1. Technical Field

The present disclosure relates to a light emitting diode technology, in particular, to a manufacturing process for improving the yield rate of a light emitting diode and a light emitting diode structure using the same.

2. Description of Related Art

As the advancement of human civilization, lighting devices have becoming the essential component in the daily life. In the early days, the lighting devices in general are incandescent light bulbs (or tungsten lamps). Hence in the past, to have the lighting device dimmed, only need to arrange an additional variable resistor turning knob between the electrical plug and the lamp. Consequently, brightness may be configured by adjusting the variable resistor. However, the incandescent lamps have the disadvantages of heating, short lifetime, low lighting efficiency, and large power consumption thus currently has almost completely obsoleted.

A light emitting diode (LED) is a solid-sate light emitting component and mainly composed of the P-type and N-type semiconductor material, further may generate self-radiating lights within the spectrums of ultraviolet light, visible lights, and infrared lights. In practice, the light emitting diodes emitting visible lights are mostly used as indicator in electronic instruments or for illumination application while the light emitting diodes emitting infrared light are utilized in optical communication application.

As LEDs have advantages including high lighting efficiency, long lifetime, hard to be damaged, low power consumption, environment friendly, and small in size, hence recently under the trends of environmental protection and energy saving, it has been broadly used in many fields, such as traffic lights, streetlamps, torch lamps, backlights of liquid crystal displays, or all types of LED lamps.

The Distributed Bragg Reflector (DBR) often has been used in the nitride-based LED structure for enhancing the lighting efficiency of the light emitting diode. The gallium nitride (GaN) and aluminum gallium nitride (AlGaN) have large refractive index difference thereby have been commonly used in developing the DBR of gallium nitride component. However, the combination of these two materials may also bring great lattice mismatch and thermal coefficient differences, consequently may facilitate generating cracks or defects in the epitaxial layer.

Moreover, the stress issues of developing the DBR using the epitaxy may impact overall lattice quality further resulting in structural defects. Especially, the structure having the DBR may contain relatively large tensile strain and often causes the epitaxial layer formed afterward unable to effectively release the strain and generate cracks. In addition the LED structure growing on the silicon substrate always has the wafer strain problem leading to crack generation. Consequently to develop DBR structure using epitaxy method, the wafer must bear large tensile strain, thus may easily generate cracks.

SUMMARY

The objective of the present is to provide a light emitting diode structure, in which prior to the fabrication of the Distributed Bragg Reflector (DBR), disposing an aluminum indium gallium nitride (AlInGaN) formed strain release layer to avoid generating film crack during the process of fabricating the DBR. Additionally, the present disclosure modifies the fabrication arrangement of the epitaxy process to have the DBR formed at last. Consequently, the formation conditions of the DBR may be modified to enhance the epitaxy quality of the DBR without affecting other epitaxial layers.

To achieve the aforementioned objectives and others, an exemplary embodiment of the present disclosure provides a light emitting diode. The light emitting diode includes a metal mirror, a bonding substrate, a DBR, a buffer layer, and a light emitting diode epitaxial structure. The bonding substrate is arranged under the metal mirror. The DBR is arranged on the metal mirror. The buffer layer is arranged on the DBR. The light emitting diode epitaxial structure is arranged on the buffer layer.

According to one exemplary embodiment of the present disclosure, the light emitting diode further includes a bonding layer, which is arranged between the bonding substrate and the metal mirror. Furthermore, the material of the bonding layer is selected from the adhesive material formed of silver paste, spontaneous conductive polymer or polymer doped with a conductive material. In addition, the DBR is directly formed between the metal mirror and the buffer layer. The DBR is formed by alternatively stacking the aluminum nitride (AlN) and gallium nitride (GaN). Moreover, the light emitting diode epitaxial structure includes a first semiconductor layer, an active layer, a second semiconductor layer, a first electrode, and a second electrode. The first semiconductor layer is arranged on the buffer layer. The active layer is arranged on the first semiconductor layer. The second semiconductor layer is arranged on the active layer. The first electrode is arranged on the first semiconductor layer. The second electrode is arranged on the second semiconductor layer.

According to one exemplary embodiment of the present disclosure the first semiconductor layer is an N-type semiconductor layer and the second type semiconductor layer is a P-type semiconductor layer. In another exemplary embodiment, the first semiconductor layer is a P-type semiconductor layer and the second type semiconductor layer is an N-type semiconductor layer. Furthermore, the buffer layer has a lattice constant between the lattice constant of the aluminum nitride and the lattice constant of gallium nitride. Additionally, the buffer layer comprises of aluminum indium gallium nitride (AlInGaN).

According to one exemplary embodiment of the present disclosure, the material comprises of In, Al, Ti, Au, W, InSn, TiN, WSi, PtIn2, Nd/Al, Ni/Si, Pd/Al, Ta/Al, Ti/Ag, Ta/Ag, Ti/Al, Ti/Au, Ti/TiN, Zr/ZrN, Au/Ge/Ni, Cr/Ni/Au, Ni/Cr/Au, Ti/Pd/Au, Ti/Pt/Au, Ti/Al/Ni/Au, Au/Si/Ti/Au/Si, and Au/Ni/Ti/Si/Ti or a combination of selected elements thereof.

To sum up, the light emitting diode is carried on a bonding substrate with the bottom layer of epitaxial structure thereof has the DBR and the metal mirror thus may increase the lighting efficiency of the light emitting diode. The DBR is formed on the top of the light emitting diode epitaxial structure hence there are no more issues of strain stacking and accumulation thereby may reduce thin film crack problem.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incor

DESCRIPTION OF THE EXEMPLARY EMBODIMENTS

Figure 1:
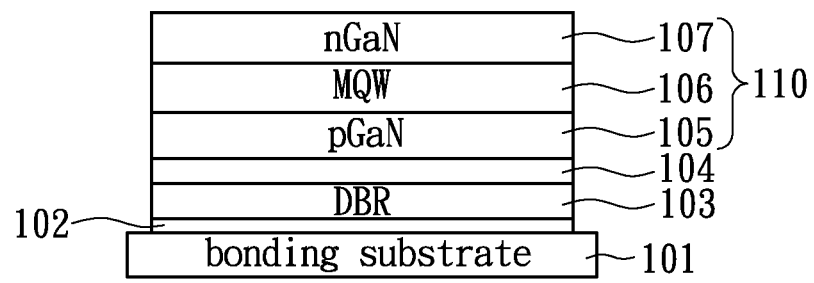
- FIG. 1 is a diagram illustrating a light emitting diode structure in accordance to an exemplary embodiment of the present disclosure.
Figure 2A:
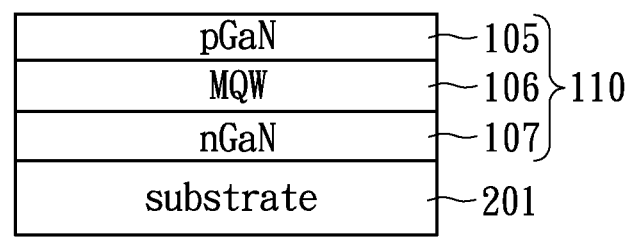
FIG. 2A~2H are diagrams respectively illustrating a light emitting diode manufacturing process in accordance to the exemplary embodiment of the present disclosure.
Figure 2B:
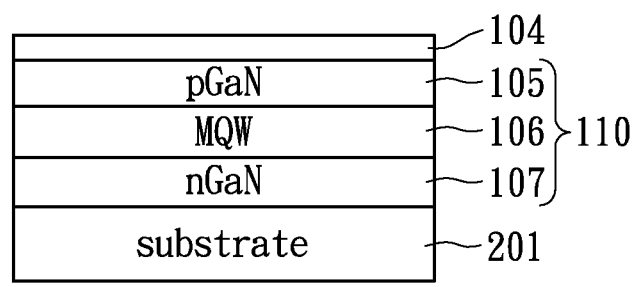
Figure 2C:
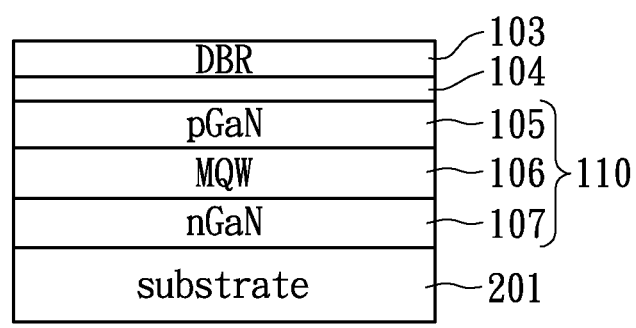
Figure 2D:
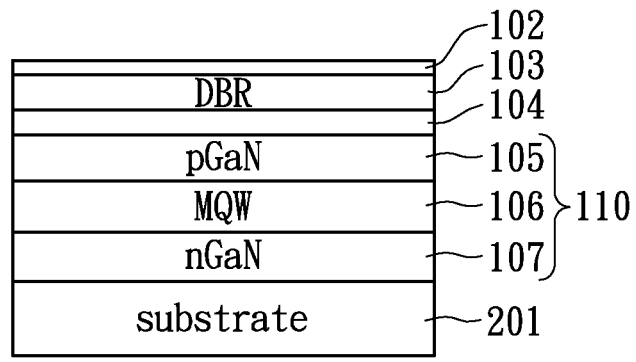
Figure 2E:
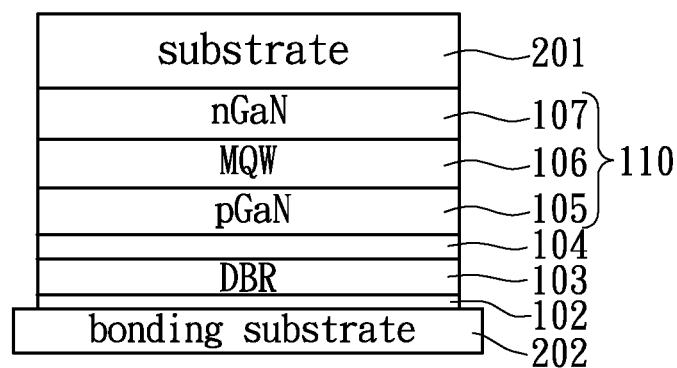
Figure 2F:
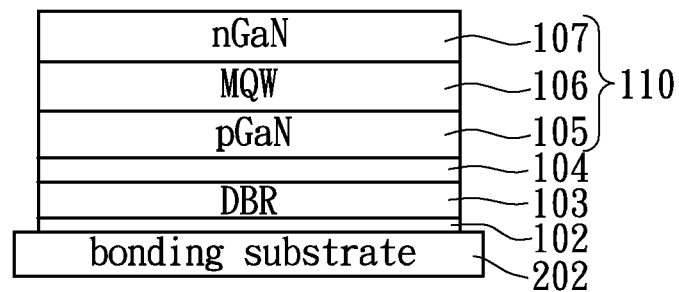
Figure 2G:
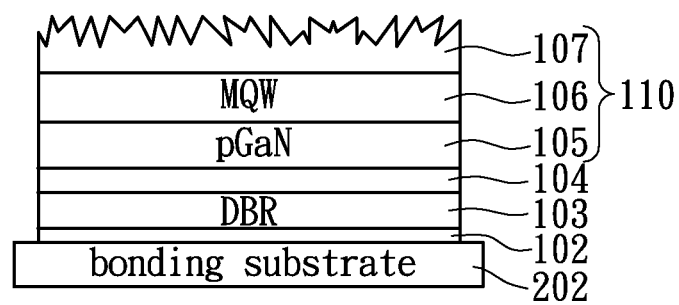
Figure 2H:
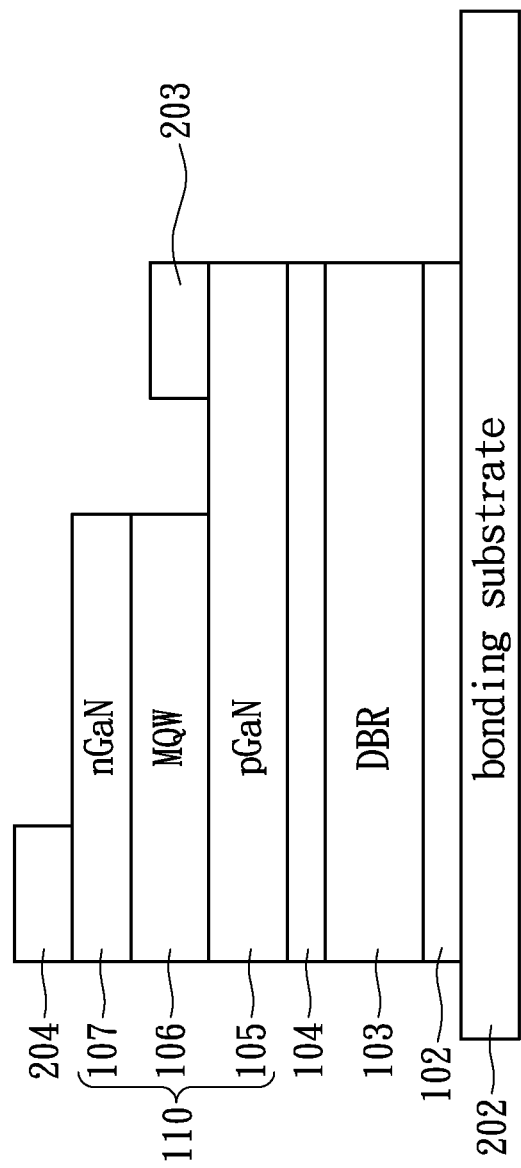

Reference will now be made in detail to the exemplary embodiments of the present disclosure, examples of which are illustrated in the accompanying drawings. Wherever possible, the same reference numbers are used in the drawings and the description to refer to the same or like parts.

FIG. 1 is a diagram illustrating a light emitting diode structure in accordance to an exemplary embodiment of the present disclosure. Please referring to FIG. 1, the structure of a light emitting diode (LED) includes a bonding substrate 101, a metal mirror 102, a distributed bragg reflector (DBR) 103, and a buffer layer 104 and a light emitting diode epitaxial structure 110. The bonding substrate 101 is arranged under the metal mirror 102. The DBR 103 is arranged on the metal mirror 102. The buffer layer 104 is arranged on the DBR 103. The LED epitaxial structure 110 is arranged on the buffer layer 104.

In particular, in the instant embodiment, the substrate used for growing the LED epitaxial structure 110 via epitaxial growth may be removed. The substrate may for example be a silicon (Si) substrate, a sapphire substrate or a silicon carbide (SiC) substrate. The LED epitaxial structure 110 may be directly bonded on the bonding substrate 101 while arranged in an upside down fashion. In other words, the final finished LED component is mainly formed of the LED epitaxial structure 110 and the bonding substrate 101 without having the initial substrate for growing the LED epitaxial structure 110. Since the LED epitaxial structure 110 has been disposed upside down, thus the light emitting side thereof is the bottom side of the initial substrate. Therefore, the thickness of the bottom substrate must be reduced via polishing or etching process to increase the lighting efficiency.

The DBR 103 is formed between the buffer layer 104 and the metal mirror 102 instead of directly formed on the silicon substrate or the sapphire substrate. It is worth to note that the buffer layer 104 is arranged between the LED epitaxial structure 110 and the DBR 103 instead of directly formed on the silicon substrate or the sapphire substrate as in the conventional method. That is the fabrication process of the DBR 103 in the instant embodiment is performed after the formation of the LED epitaxial structure 110. Consequently, the DBR 103 is arranged between the LED epitaxial structure 110 and the metal mirror 102.

It is worth to note that the bonding substrate 101 may be an integrated circuit (IC) substrate comprising material of printed circuit board (PCB) or ceramic or plastic or glass fiber, however, the instant embodiment is not limited thereto. The material of the metal mirror 102 may be selected from In, Al, Ti, Au, W, InSn, TiN, WSi, PtIn2, Nd/Al, Ni/Si, Pd/Al, Ta/Al, Ti/Ag, Ta/Ag, Ti/Al, Ti/Au, Ti/TiN, Zr/ZrN, Au/Ge/Ni, Cr/Ni/Au, Ni/Cr/Au, Ti/Pd/Au, Ti/Pt/Au, Ti/Al/Ni/Au, Au/Si/Ti/Au/Si, and Au/Ni/Ti/Si/Ti or a combination of selected elements thereof. A bonding layer (not shown) is disposed between the bonding substrate 101 and the metal mirror 102 for bonding the bonding substrate 101 and the metal mirror 102. The material of the bonding layer is selected from the adhesive material formed of silver paste, spontaneous conductive polymer or polymer doped with a conductive material, however the instant embodiment is not limited to the example provided herein.

The DBR 103 is formed by alternatively stacking aluminum nitride (AlN) and gallium nitride (GaN). For instance, sequentially stacking a layer of aluminum nitride and a layer of gallium nitride to form the DBR epitaxial structure. of the aluminum nitride and gallium nitride may be formed by utilizing the metal organic chemical vapor deposition (MOCVD). It should be specially noted that the instant embodiment does not limit the epitaxial structure, number of stacked layers of the aluminum nitride and gallium nitride, the thickness of each stacked layer as well as the formation method thereof associated with the DBR 103.

The buffer layer 104 has the lattice constant between the lattice constant of the aluminum nitride and the lattice constant of gallium nitride, for instance may be aluminum indium gallium nitride (AlInGaN), however the instant embodiment is not limited thereto. The buffer layer 104 is used as strain release layer and may reduce the strain issues generated from forming the DBR 103 on the LED epitaxial structure 110 thereby reduce the occurrence film crack.

The aforementioned LED epitaxial structure 110 includes a first semiconductor layer 105, an active layer 106, and a second semiconductor layer 107. In the instant embodiment, the first semiconductor layer 105 may be a P-type semiconductor layer, e.g., magnesium doped aluminum gallium indium phosphide (AlGaInP) or magnesium doped P-type gallium nitride (pGaN). The second semiconductor layer 107 may be an N-type semiconductor layer, e.g., silicon doped aluminum gallium indium phosphide (AlGaInP) or silicon doped N-type gallium nitride (n-GaN). The active layer 106 may be a Multiquantum Well (MQW) structure, e.g., indium gallium nitride/Gallium Nitride ($In_{0.3}Ga_{0.7}N$/GaN) quantum well structure. It is worth to note that in another embodiment of the present disclosure, the first semiconductor layer 105 may be an N-type semiconductor layer and the second semiconductor layer 107 may be a P-type semiconductor layer.

The LED epitaxial structure 110 may be formed through utilizing metal organic chemical-vapor deposition (MOCVD), the Liquid Phase Epitaxy (LPE) or the Molecular Beam epitaxy (MBE) technique, however the instant embodiment is not limited thereto.

In addition, it is worth to note that conductive electrodes (not shown) may be formed on the first semiconductor layer 105 and the second semiconductor layer 107, wherein the material for the conductive electrodes may be Ni/Au or Ti/Al/Pt/Au, and the instant embodiment is not limited thereto. The conductive electrodes may utilize a low resistance interface formed by evaporation method to generate ohmic contact between the metal and the semiconductor for the two way communication.

Next, the manufacturing process for forming the light emitting diode structure is provided. Please refer to FIG. 2A to FIG. 2H, which respectively illustrate manufacturing process of the light emitting diode structure in accordance to the embodiment of the present disclosure. The manufacturing process for the light emitting diode of the instant embodiment includes the following steps:

Step 1: Please refer to FIG. 2A, forming a LED epitaxial structure 110 on a substrate 201 (e.g., a silicon substrate, a sapphire substrate or a silicon carbide substrate), wherein the LED epitaxial structure 110 at least includes a first type semiconductor 105, an active layer 106, and a second semiconductor layer 107. It is worth to note that the preferable order for the epitaxy is nGaN→MQW→pGaN, however the instant embodiment is not limited herein.

Step 2: Please refer to FIG. 2B, forming a buffer layer 104 comprising material of AlInGaN on the LED epitaxial structure 110. The buffer layer 107 may relief the strain caused by growing the DBR structure to avoid having film crack issue.

Step 3: Please refer 2C, developing the DBR 103 on the buffer layer 104 via epitaxy growth method after forming the buffer layer 104 such that the strain generated from growing the DBR may be reduce via the buffer layer 104. Since the DBR 103 is formed on the top side of the LED epitaxial structure 110, henceforth there is no strain stacking and accumulation issue thereby may reduce the difficulty of developing DBR 103 and issue of film crack generation.

Step 4: Please refer to 2D, forming a metal mirror 102 on the DBR 103, wherein the metal mirror 102 may be formed via sputter technique.

Step 5: Please refer to 2E, flipping the formed LED epitaxial structure 110 (chip) and bonding the metal mirror 102 on a bonding substrate 202 using bonding material, wherein the bonding material is selected from the adhesive material formed of silver paste, spontaneous conductive polymer or polymer doped with a conductive material. Or equivalently, a bonding layer is formed between the metal mirror 102 and the bonding substrate 202.

Step 6: Please refer to 2F, removing the substrate 201 using laser lift off (LLO) or polishing technique.

Step 7: Please refer to 2G, etching rough surface on the surface of epitaxy using dry etching method.

Step 8: Please refer to 2H, forming Mesa after the formation of the LED epitaxial structure 110 through defining the structure of LED epitaxial structure 110 by means of lithography and etching process. Moreover, respectively form conductive electrodes 203, 204 on the first semiconductor layer 105 and the second semiconductor layer 107 as the anode and the cathode of the LED.

It should be noted that the manufacturing process of the light emitting diode further includes lithography, etching, cleaning, and cutting process. Based on the disclosure of the instant embodiment, those skilled in the art should be able to infer the above described manufacturing process and further descriptions are therefore omitted.

Specially, since in the manufacturing process of the instant embodiment may flip the chip, hence the order of the LED epitaxial structure 110 from one side of the DBR 103 to the light emitting surface (i.e., nGaN→MQW→pGaN) and the order of epitaxy growth (i.e., pGaN→MQW→nGaN) are reversed. The manufacturing process for the DBR 103 is performed after the LED epitaxial structure 110. Moreover, the buffer layer 104 is formed on the LED epitaxial structure 110 prior to the formation of DBR 103, thereby reduce the occurrence of film crack. In addition, since the DBR 103 is the last layer of the epitaxial structure, thus the growth condition of the DBR 103 may be adjusted to increase the epitaxial quality without affecting other epitaxial layers.

Furthermore, in comparison to the formation of DBR structure (e.g., SiO2/TiO2) using sputter method, the series resistance associated with the material of the DBR (e.g., AlN/GaN) via epitaxial growth is smaller than the dielectric material thereby may facilitate the application on the vertical components.

In summary, the light emitting diode of the present disclosure has the DBR and the metal mirror which may effective increase the lighting efficiency of the light emitting diode. Moreover, the manufacturing process of forming the buffer layer and DBR on the top of the LED epitaxial structure may effective reduce the strain issue caused by the DBR thereby may avoid generating film crack.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A light emitting diode, comprising:
    a metal mirror;
    a bonding substrate, arranged under the metal mirror;
    a distributed bragg reflector, arranged on the metal mirror;
    a buffer layer, arranged on the distributed bragg reflector; and
    a light emitting diode epitaxial structure arranged on the buffer layer, and the light emitting diode epitaxial structure comprising:
        a first semiconductor layer arranged on the buffer layer;
        an active layer arranged on the first semiconductor layer;
        a second semiconductor layer arranged on the active layer;
        a first electrode arranged on the first semiconductor layer; and
        a second electrode arranged on the second semiconductor layer.

2. The light emitting diode according to claim 1, further comprising:
    a bonding layer, arranged between the bonding substrate and the metal mirror.

3. The light emitting diode according to claim 2, wherein the material of bonding layer is selected from adhesive material formed of silver paste, spontaneous conductive polymer, or polymer doped with a conductive material.

4. The light emitting diode according to claim 1, wherein the distributed bragg reflector is directly formed between the metal mirror and the buffer layer.

5. The light emitting diode according to claim 1, wherein the distributed bragg reflector is formed by alternatively stacking aluminum nitride (AlN) and gallium nitride (GaN).

6. The light emitting diode according to claim 1, wherein the first semiconductor layer is an N-type semiconductor layer and the second type semiconductor layer is a P-type semiconductor layer, or the first semiconductor layer is a P-type semiconductor layer and the second type semiconductor layer is an N-type semiconductor layer.

7. The light emitting diode according to claim 1, wherein the buffer layer has a lattice constant between the lattice constant of the aluminum nitride and the lattice constant of gallium nitride.

8. The light emitting diode according to claim 1, wherein the buffer layer comprises of aluminum indium gallium nitride (AlInGaN).

9. A light emitting diode, comprising:
    a metal mirror;
    a bonding substrate, arranged under the metal mirror;
    a distributed bragg reflector, arranged on the metal mirror;
    a buffer layer, arranged on the distributed bragg reflector; and
    a light emitting diode epitaxial structure, arranged on the buffer layer;
    wherein the metal mirror comprises of In, Al, Ti, Au, W, InSn, TiN, WSi, PtIn2, Nd/Al, Ni/Si, Pd/Al, Ta/Al, Ti/Ag, Ta/Ag, Ti/Al, Ti/Au, Ti/TiN, Zr/ZrN, Au/Ge/Ni, Cr/Ni/Au, Ni/Cr/Au, Ti/Pd/Au, Ti/Pt/Au, Ti/Al/Ni/Au, Au/Si/Ti/Au/Si, and Au/Ni/Ti/Si/Ti or a group formed of the alloy metal thereof;
wherein the light emitting diode epitaxial structure comprising:
a first semiconductor layer arranged on the buffer layer;
an active layer arranged on the first semiconductor layer;
a second semiconductor layer arranged on the active layer;
a first electrode arranged on the first semiconductor layer; and
a second electrode arranged on the second semiconductor layer.

10. The light emitting diode according to claim 9, further comprising:
a bonding layer, arranged between the bonding substrate and the metal mirror.

11. The light emitting diode according to claim 10, wherein the material of bonding layer is selected from adhesive material formed of silver paste, spontaneous conductive polymer, or polymer doped with a conductive material.

12. The light emitting diode according to claim 9, wherein the distributed bragg reflector is directly formed between the metal mirror and the buffer layer.

13. The light emitting diode according to claim 9, wherein the distributed bragg reflector is formed by alternatively stacking the aluminum nitride (AlN) and gallium nitride (GaN).

14. The light emitting diode according to claim 9, wherein the first semiconductor layer is an N-type semiconductor layer and the second type semiconductor layer is a P-type semiconductor layer, or the first semiconductor layer is a P-type semiconductor layer and the second type semiconductor layer is an N-type semiconductor layer.

15. The light emitting diode according to claim 9, wherein the buffer layer has a lattice constant between the lattice constant of the aluminum nitride and the lattice constant of gallium nitride.

16. The light emitting diode according to claim 9, wherein the buffer layer comprises of aluminum indium gallium nitride (AlInGaN).

* * * * *